US012785630B2

(12) United States Patent
Scott et al.

(10) Patent No.: US 12,785,630 B2
(45) Date of Patent: Nov. 3, 2026

(54) POWER AMPLIFIER WITH FEEDBACK BALLAST RESISTANCE

(71) Applicant: Qorvo US, Inc., Greensboro, NC (US)

(72) Inventors: Baker Scott, San Jose, CA (US); Chong Woo, Fremont, CA (US); George Maxim, Saratoga, CA (US)

(73) Assignee: Qorvo US, Inc., Greensboro, NC (US)

( * ) Notice: Subject to any disclaimer, the term of this patent is extended or adjusted under 35 U.S.C. 154(b) by 685 days.

(21) Appl. No.: 17/589,050

(22) Filed: Jan. 31, 2022

(65) Prior Publication Data

US 2023/0246599 A1 Aug. 3, 2023

(51) Int. Cl.

| | |
|---|---|
| ***H03F 1/30*** | (2006.01) |
| ***H03F 3/19*** | (2006.01) |
| ***H03F 3/24*** | (2006.01) |
| ***H03F 3/45*** | (2006.01) |

(52) U.S. Cl.

CPC ............... *H03F 1/302* (2013.01); *H03F 3/19* (2013.01); *H03F 3/245* (2013.01); *H03F 3/45475* (2013.01); *H03F 2200/42* (2013.01); *H03F 2200/447* (2013.01); *H03F 2200/451* (2013.01)

(58) Field of Classification Search

CPC ............... H03F 1/302; H03F 2200/447; H03F 2200/451; H03F 3/245; H03F 3/45475; H03F 3/19; H03F 2200/42

USPC .......................................................... 330/296

See application file for complete search history.

(56) References Cited

U.S. PATENT DOCUMENTS

| | | | | |
|---|---|---|---|---|
| 9,287,829 B2 * | 3/2016 | Nobbe | .................... | H03F 3/195 |
| 10,277,168 B2 * | 4/2019 | Kovac | ..................... | H03F 3/195 |
| 10,355,645 B2 * | 7/2019 | Hwang | ................... | H03F 1/301 |
| 11,005,423 B2 * | 5/2021 | Li | ............................ | H03F 3/19 |
| 2007/0139120 A1 * | 6/2007 | Luo | .......................... | H03F 1/30 330/296 |

(Continued)

FOREIGN PATENT DOCUMENTS

| | | |
|---|---|---|
| CN | 2785256 Y * | 5/2006 |
| CN | 103326675 A * | 9/2013 |

(Continued)

OTHER PUBLICATIONS

Järvinen et al., Bias Circuits for GaAs HBT Power Amplifiers, 2001, IEEE (Year: 2001).*

(Continued)

*Primary Examiner* — Andrea Lindgren Baltzell
*Assistant Examiner* — Lance Torbjorn Bartol
(74) *Attorney, Agent, or Firm* — Withrow & Terranova, P.L.L.C.

(57) ABSTRACT

A power amplifier with feedback ballast resistance is disclosed. In one aspect, a power amplifier cell may receive a bias signal from a bias circuit where the bias circuit includes a feedback loop having an impedance that, from the perspective of the bias signal is relatively low impedance, but from a ballast thermal control perspective provides sufficient resistance to avoid thermal runaway. In exemplary aspects, this feedback loop may be extended to operate with multiple power amplifier cells and provide differential mode thermal control optimized for individual cell bias signal control and common mode thermal control optimized for thermal control of the collective power amplifier cells of the power amplifier.

13 Claims, 20 Drawing Sheets

(56) References Cited

U.S. PATENT DOCUMENTS

| | | | | |
|---|---|---|---|---|
| 2020/0350876 | A1* | 11/2020 | Nielsen | H03F 1/0216 |
| 2021/0013842 | A1 | 1/2021 | Soga | |
| 2021/0126586 | A1 | 4/2021 | Soga | |

FOREIGN PATENT DOCUMENTS

| | | | | | |
|---|---|---|---|---|---|
| CN | 204272038 | U | * | 4/2015 | |
| JP | 2004537212 | A | * | 12/2004 | H03F 1/26 |
| JP | 2020048184 | A | * | 3/2020 | |

OTHER PUBLICATIONS

Chang et al., Temperature Insensitive PA Bias Circuit With Digital Control Interface Using InGaP/GaAs HBT Technology, 2015, IEEE (Year: 2015).*

Extended European Search Report for European Patent Application No. 23154015.4, mailed Jun. 30, 2023, 12 pages.

Examination Report for European Patent Application No. 23154015.4, mailed Apr. 22, 2026, 13 pages.

* cited by examiner

POWER AMPLIFIER WITH FEEDBACK BALLAST RESISTANCE

BACKGROUND

I. Field of the Disclosure

The technology of the disclosure relates generally to power amplifiers and, more specifically, to power amplifiers with ballast resistors to prevent thermal runaway.

II. Background

Computing devices abound in modern society, and more particularly, mobile communication devices have become increasingly common. The prevalence of these mobile communication devices is driven in part by the many functions that are now enabled on such devices. Increased processing capabilities in such devices means that mobile communication devices have evolved from pure communication tools into sophisticated mobile entertainment centers, thus enabling enhanced user experiences. Mobile communication devices typically include a power amplifier to boost signals for transmission when communicating. The power amplifier may include multiple stages. The use and arrangement of multi-cell power amplifier stages may cause individual amplifiers to generate waste heat. Under the right conditions, such waste heat may contribute to thermal runaway within the power amplifier causing one or more amplifiers to fail. While ballast resistances have been used to reduce the likelihood of thermal runaway, such an approach may lead to significant stage de-biasing as the current rectifies up at mid-power levels, resulting in non-linear performance, which negatively impacts compliance with emerging cellular communication standards and may negatively impact the user experience. Accordingly, there is room for improvement in the formation of power amplifiers that avoid thermal runaway.

SUMMARY

Aspects disclosed in the detailed description include a power amplifier with feedback ballast resistance. In particular, a power amplifier cell may receive a bias signal from a bias circuit where the bias circuit includes a feedback loop having an impedance that, from the perspective of the bias signal is relatively low impedance, but from a ballast thermal control perspective provides sufficient resistance to avoid thermal runaway. In exemplary aspects, this feedback loop may be extended to operate with multiple power amplifier cells and provide differential mode thermal control optimized for individual cell bias signal control and common mode thermal control optimized for thermal control of the collective power amplifier cells of the power amplifier. Such circuitry provides sufficient ballast impedance for thermal control while also improving linear performance and avoiding de-biasing individual power amplifier cells.

In this regard in one aspect, a circuit is disclosed. The circuit comprises a power amplifier cell. The circuit also comprises a bias circuit coupled to the power amplifier cell at an input node. The bias circuit is configured to provide a bias signal to the power amplifier cell through the input node. The bias circuit comprises a feedback network. The feedback network is configured to provide differential mode ballasting stability and common mode ballasting stability. The feedback network is also configured to provide a ballast resistance to the bias signal under three hundred ohms (300Ω).

DETAILED DESCRIPTION

Figure 1A:
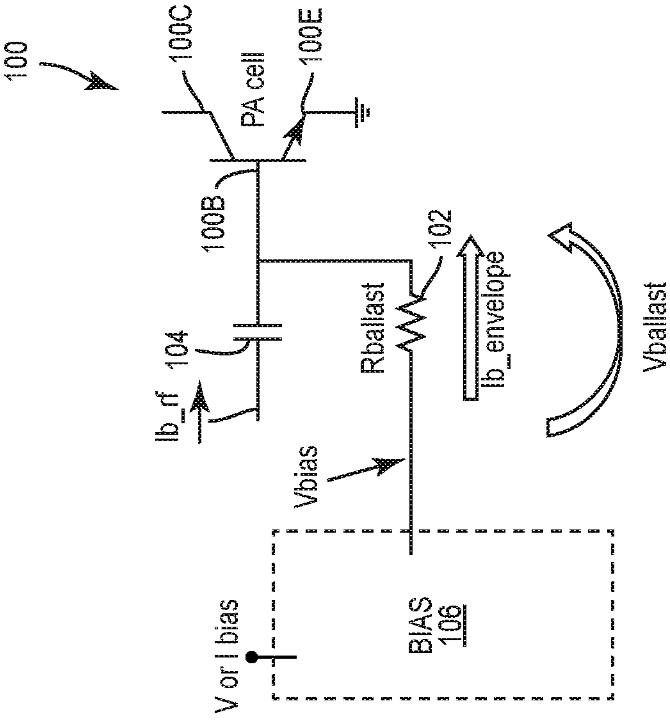
FIG. 1A is a circuit diagram of a conventional power amplifier cell having a bias circuit that uses ballast resistance to prevent thermal runaway.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms, used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include a power amplifier with feedback ballast resistance. In particular, a power amplifier cell may receive a bias signal from a bias circuit where the bias circuit includes a feedback loop having an impedance that, from the perspective of the bias signal is relatively low impedance, but from a ballast thermal control perspective provides sufficient resistance to avoid thermal runaway. In exemplary aspects, this feedback loop may be extended to operate with multiple power amplifier cells and provide differential mode thermal control optimized for individual cell bias signal control and common mode thermal control optimized for thermal control of the collective power amplifier cells of the power amplifier. Such circuitry provides sufficient ballast impedance for thermal control while also improving linear performance and avoiding de-biasing individual power amplifier cells.

Figure 1B:
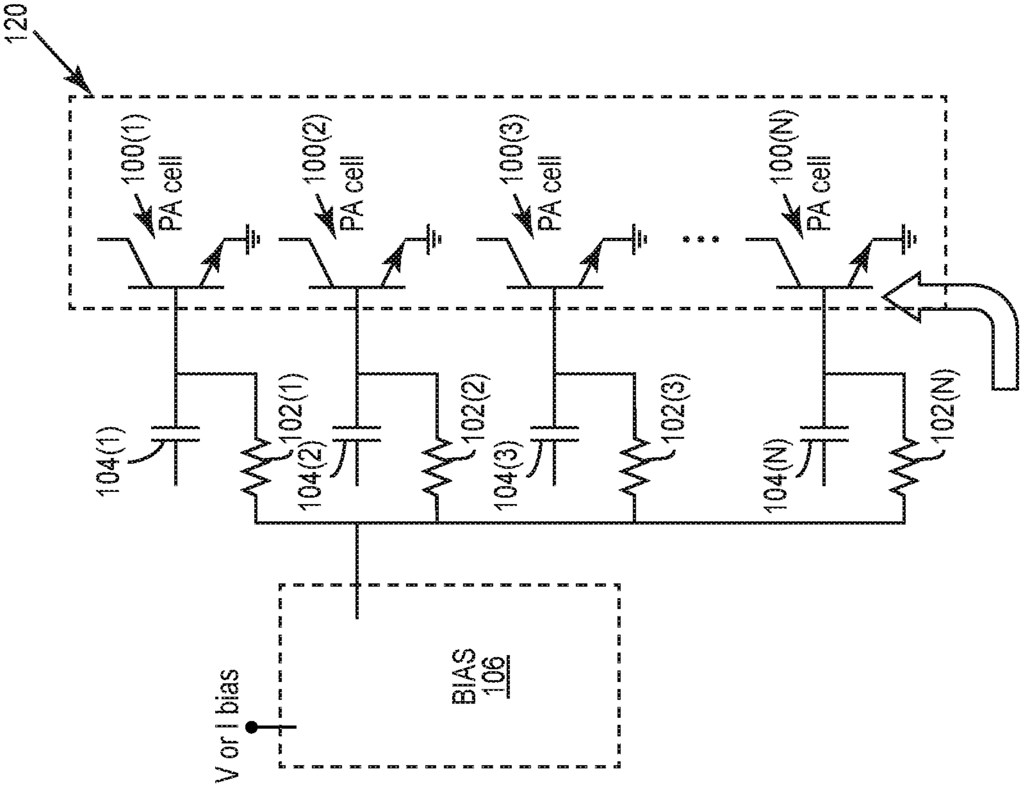
FIG. 1B is a circuit diagram of a conventional power amplifier stage having multiple power amplifier cells, each receiving a bias signal through ballast resistance to prevent thermal runaway.
Figure 1C:
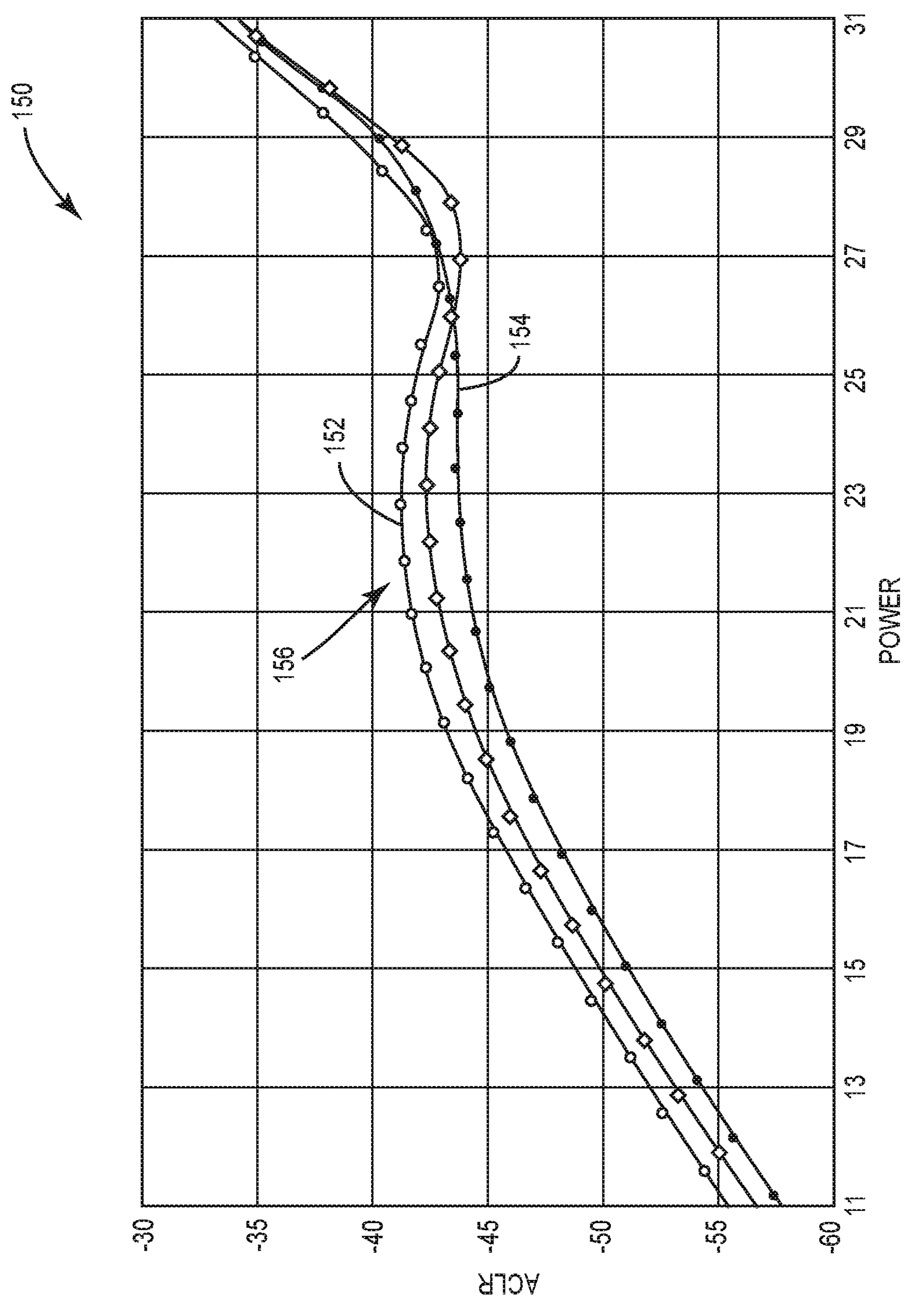
FIG. 1C is a graph showing adjacent channel leakage ratio (ACLR) versus power for variously-sized ballast resistances and associated non-linearities.

Before addressing exemplary aspects of the present disclosure, a brief overview of a conventional power amplifier stage having ballast resistance to prevent thermal runaway is provided with reference to FIGS. 1A-1C. A discussion of exemplary aspects of a power amplifier with feedback ballast resistance begins below with reference to FIG. 2.

In this regard, FIG. 1A is a circuit diagram of a conventional power amplifier cell 100 having a ballast resistance 102, which may be a single ballast resistor, to prevent thermal runaway. The power amplifier cell 100 may be a bipolar junction transistor (BJT) having a collector 100C, a base 100B, and an emitter 100E. The base 100B receives a radio frequency (RF) current (Ib_rf) through a capacitor 104 and a ballast current (Ib_envelope) through the ballast resistance (Rballast) 102. The ballast current Ib_envelope is set by a bias circuit 106. The bias circuit 106 knows the value of the ballast resistance 102 and can set a voltage level Vballast by controlling the ballast current Ib_envelope. Setting the voltage level Vballast changes the voltage at the base 100B, allowing for bias control of the power amplifier cell 100. When current at the base 100B increases due to Ib_rf, the voltage Vballast will help pull the current level back down to levels where thermal runaway is mitigated.

Using ballast resistance composed of one or more ballast resistors to prevent thermal runaway may be extended to a power amplifier stage having multiple power amplifier cells as better illustrated in FIG. 1B. Specifically, a power amplifier stage 120 may include multiple power amplifier cells 100(1)-100(N). Each power amplifier cell 100(1)-100(N) may have an associated ballast resistance 102(1)-102(N) to prevent thermal runaway. Each power amplifier cell 100(1)-100(N) receives an RF signal through a respective capacitor 104(1)-104(N). A bias circuit 106 may provide a bias signal to each power amplifier cell 100(1)-100(N) through the ballast resistors 102(1)-102(N).

The presence of a ballast resistance 102 for a power amplifier cell 100 does provide protection against thermal runaway loosely proportional to the size of the ballast resistor, with larger resistors providing greater protection. However, as seen by graph 150 in FIG. 1C, the improved thermal control comes at the cost of non-linear performance of the adjacent channel leakage ratio (ACLR) versus power. Specifically, line 152 shows a relatively large ballast resistance (e.g., greater than five hundred ohms (>500Ω)) while line 154 shows a relatively small ballast resistance (e.g., ≈300Ω). Non-linearities show up as a "back-up hump" 156. Line 154 is the most linear, but still has an ACLR of around −43 decibels (dB) near the hump 156. The fourth generation (4G) of cellular standards tolerated ACLRs of around mid-thirties dB, and thus, lines 152 and 154 were both generally acceptable for devices operating under 4G standards. However, the advent of fifth generation (5G) standards requires in excess of −45 dB in the ranges of interest. Accordingly, the conventionally-sized ballast resistors (e.g., >300Ω) are no longer able to provide acceptable ACLRs. While smaller ballast resistors may be used, simply reducing the size of the ballast resistor will negatively impact thermal control and risk damage to the power amplifier stage.

While emitter ballasting is possible, emitter ballasting hurts output power and efficiency. These disadvantages make emitter ballasting unsuitable for most mobile applications. Accordingly, there remains room for improvement in providing thermal control while providing desired bias performance. Exemplary aspects of the present disclosure add a feedback network to a bias circuit to provide improved common mode and differential mode ballasting for power amplifier stages. The feedback network allows the external ballasting resistance (e.g., ballast resistor 102) to be reduced or eliminated such that the bias signal from the bias circuit sees a relatively small resistance, but the resistance available to provide thermal control may still be relatively large (e.g., >250-300Ω).

As used herein, differential mode ballasting refers to individual ballasting to provide thermal control to an individual power amplifier cell. Further, as used herein, common mode ballasting refers to ballasting such that all the power amplifier cells within a power amplifier stage are thermally controlled.

Figure 2:
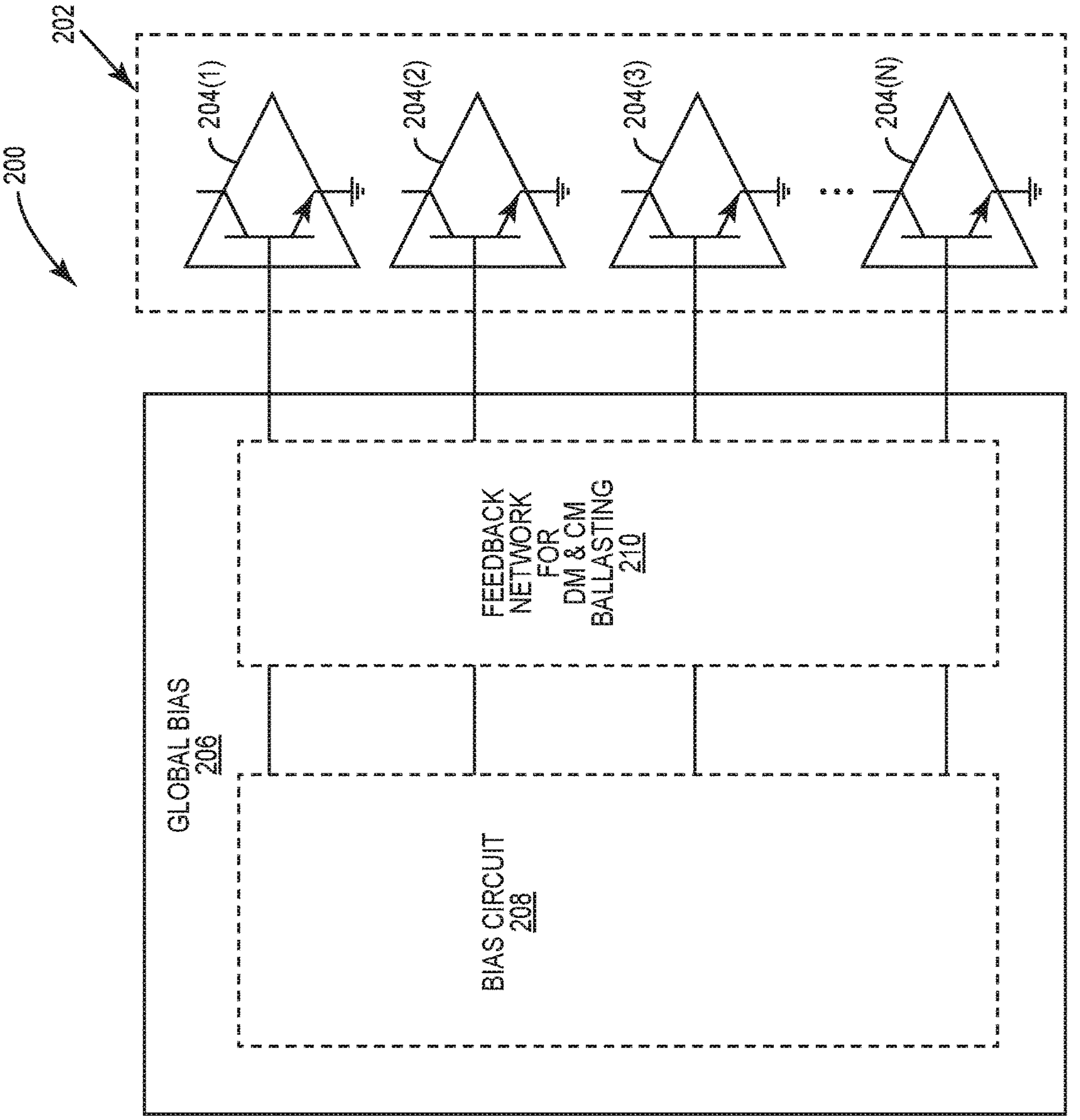
FIG. 2 is a mixed block and circuit diagram of a single-ended power amplifier stage with multiple power amplifier cells receiving bias signals from a bias circuit having a feedback network for differential mode and common mode ballasting to improve linearity while preventing thermal runaway.

FIG. 2 provides a diagram of a circuit 200 that includes a power amplifier stage 202 having a plurality of power amplifier cells 204(1)-204(N). The power amplifier stage 202 may be a single-ended power amplifier stage. The power amplifier stage 202 may receive bias signals from a global bias network 206 that has a bias circuit 208 and a feedback network 210. The feedback network 210 includes circuitry to enable differential mode ballasting and common mode ballasting. The feedback network 210 has a loop gain as explained in greater detail below. More details on the bias circuit 208 are provided below beginning with reference to FIG. 10. More details about the feedback network 210 are provided below beginning with reference to FIG. 5. Before moving to those details, the breadth of application of the present disclosure is expanded.

Figure 3:
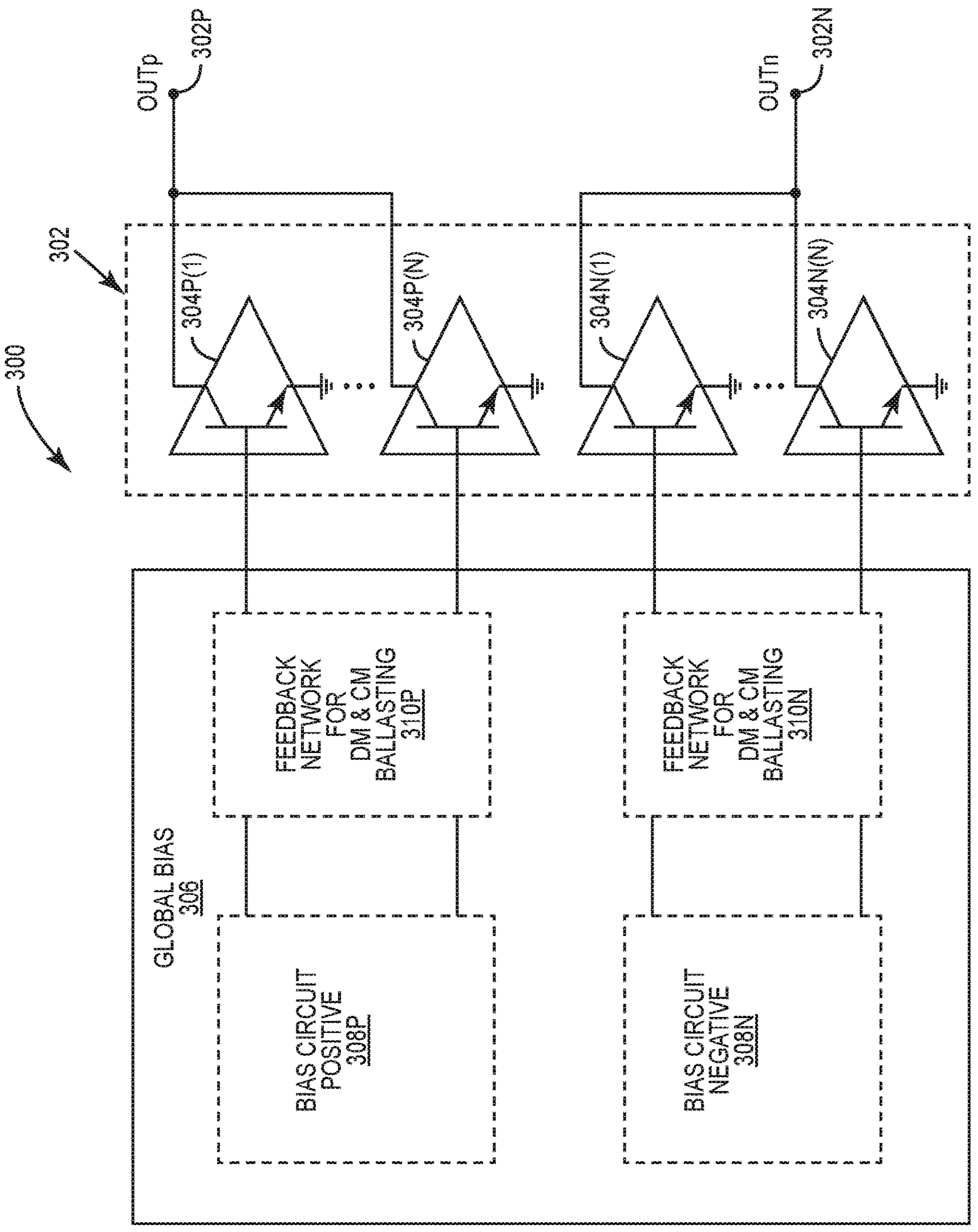
FIG. 3 is a mixed block and circuit diagram of a differential-ended power amplifier stage with multiple power amplifier cells receiving bias signals from a differential bias circuit having a feedback network for differential mode and common mode ballasting to improve linearity while preventing thermal runaway.

In this regard, the concepts of the present disclosure may be applied to a differential power amplifier stage as shown by circuit 300 in FIG. 3. The circuit 300 includes a differential power amplifier stage 302 having a differential output 302P, 302N and a plurality of power amplifier cells 304P(1)-304P(N), 304N(1)-304N(N). The power amplifier stage 302 may receive bias signals from a global bias network 306 that has a positive bias circuit 308P and a negative bias circuit 3081. Additionally, the global bias network 306 may include a positive feedback network 310P and a negative feedback network 310N. The positive feedback network 310P provides bias signals to the positive power amplifier cells 304P(1)-304P(N), and the negative feedback network 310N provides bias signals to the negative power amplifier cells 304N(1)-304N(N). As with the feedback network 210 of FIG. 2, the feedback networks 310P, 310N include circuitry to enable differential mode and common mode ballasting.

Figure 4:
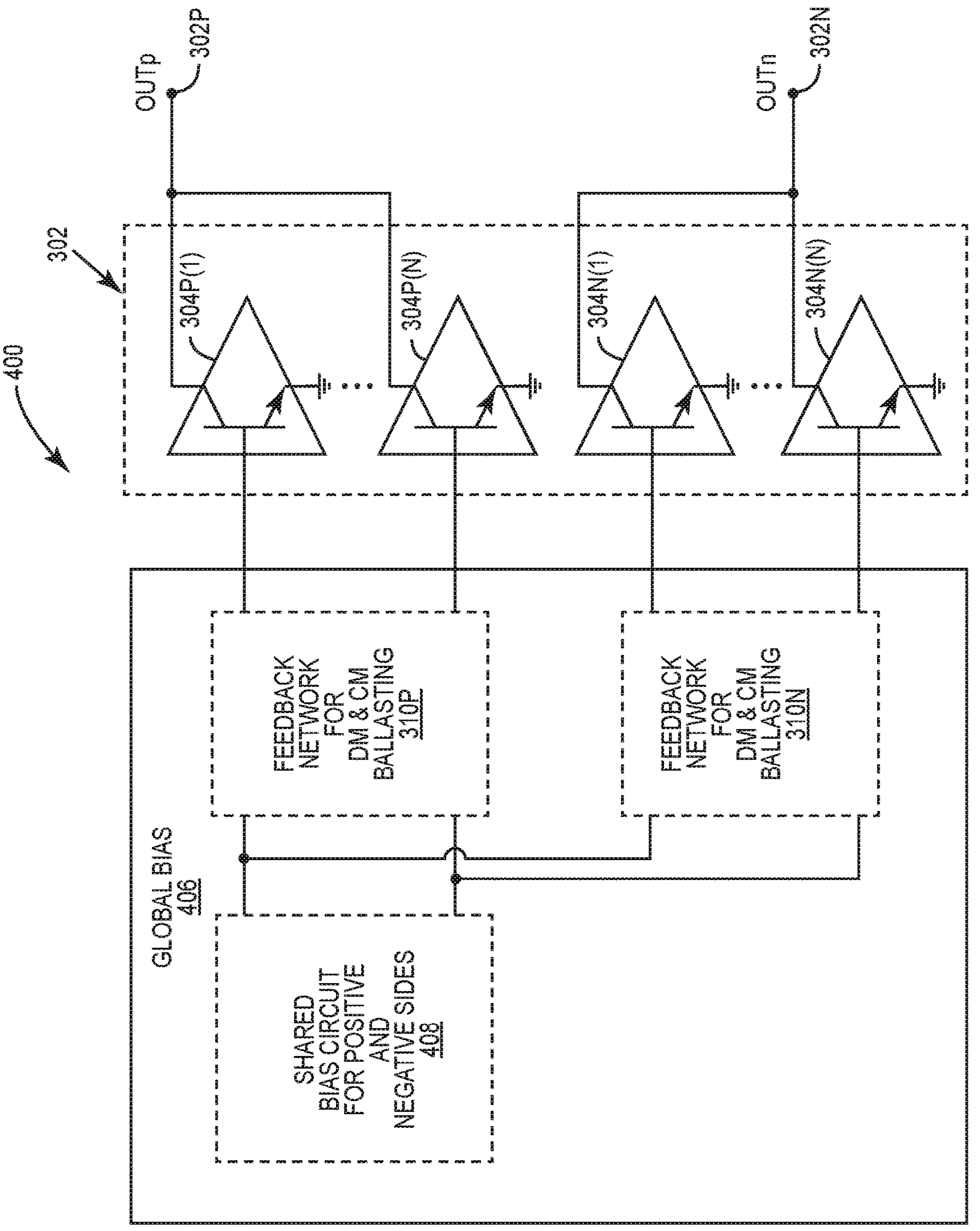
FIG. 4 is a mixed block and circuit diagram of a differential-ended power amplifier stage with multiple power amplifier cells receiving bias signals from a unitary bias circuit having two feedback networks for differential mode and common mode ballasting to improve linearity while preventing thermal runaway.

Instead of a dedicated positive bias circuit 308P and negative bias circuit 308N, the bias circuit may be shared. Thus, as illustrated in circuit 400 in FIG. 4, a global bias network 406 may include a shared bias circuit 408 that generates bias signals and uses separate feedback networks 310P, 310N. In other regards, the circuit 400 and elements thereof are substantially similar to the circuit 300 of FIG. 3 and numbers are reused to show common functionality.

Figure 5:
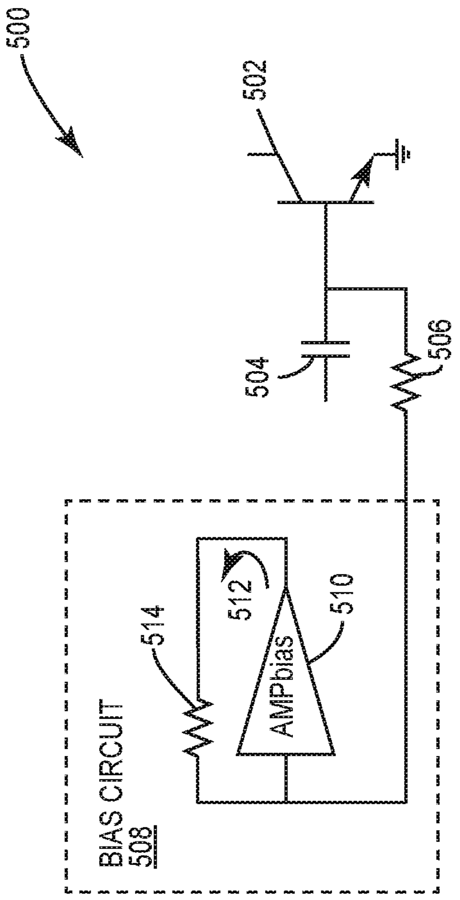
FIG. 5 is circuit diagram showing an exemplary feedback network within a bias circuit for a single power amplifier cell that also uses an external ballast resistance to improve common mode ballasting.

For simplicity, more details about the feedback network are initially shown relative to a generic bias circuit and a single power amplifier cell. Thus, FIG. 5 illustrates a circuit 500 that has a single power amplifier cell 502. An RF signal is provided to a base of the power amplifier cell 502 through a capacitor 504 or said another way, the capacitor 504 is configured to receive an RF input signal. In this regard, both the base of the power amplifier cell 502 and the capacitor 504 may be considered coupled to an input node. A ballast resistor 506 is also coupled to the base of the power amplifier cell 502 via the input node and provides a bias signal thereto. A bias circuit 508 generates the bias signal from a bias amplifier circuit 510. The bias amplifier circuit 510 includes a feedback network 512 that includes, at a minimum, a feedback impedance 514 such as a feedback resistor. Use of the feedback network 512 allows the ballast resistor 506 to have a relatively low value (e.g., less than approximately 150Ω, and more specifically less than approximately 100Ω, and even more specifically less than approximately 50Ω), but still provide desired common mode ballasting. The remainder of the thermal control is provided by the feedback impedance 514, which may be a higher value resistor (e.g., 200-295Ω such that the sum of the resistance seen by the base is around 300+Ω). While the feedback impedance 514 may be relatively large, the bias signal sees a much lower impedance as the sum of the resistance is divided by the loop gain of the feedback loop. Further examples will be provided below. As a further note of nomenclature, approximately as used herein means within five percent (5%).

Figure 6:
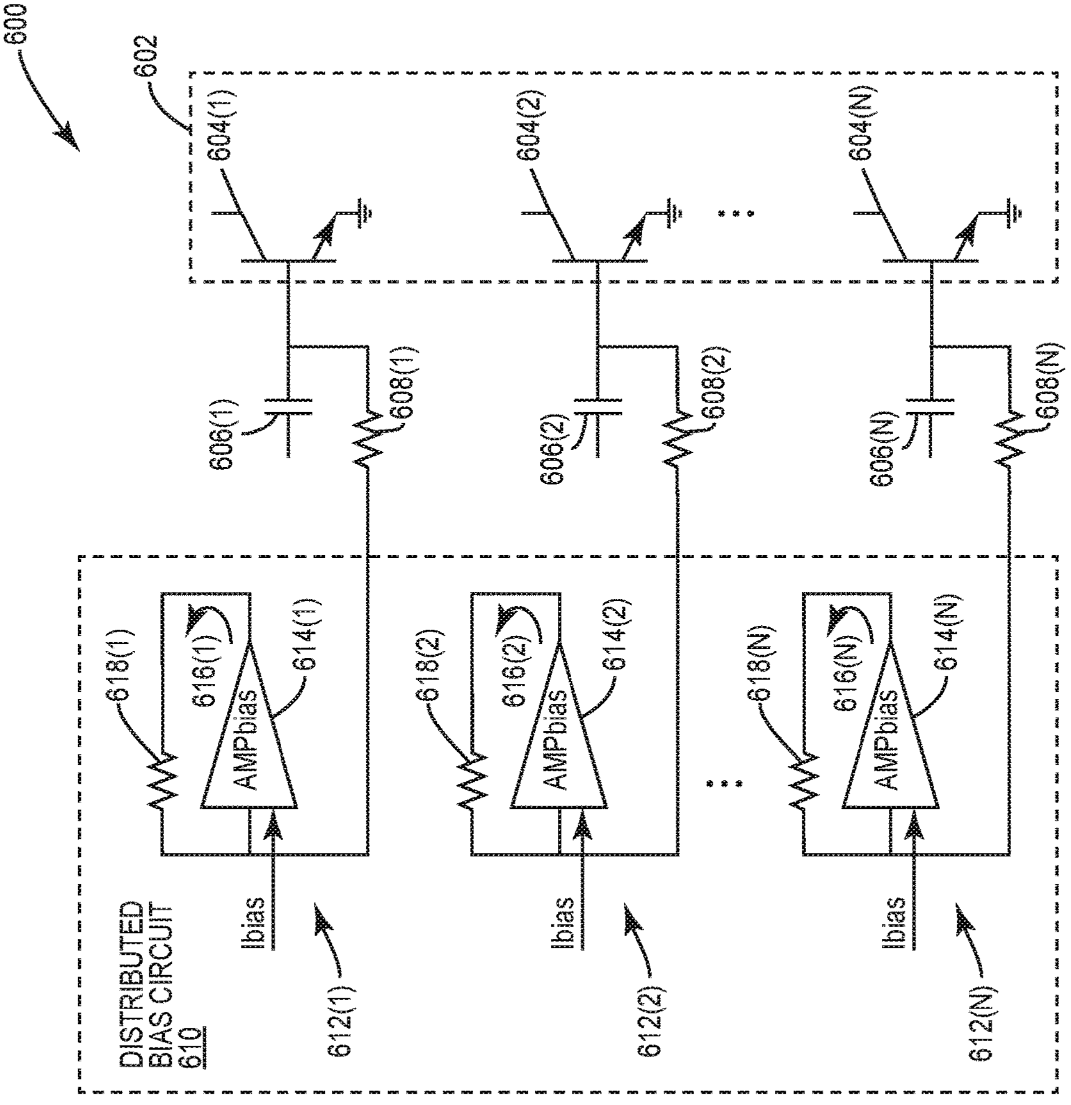
FIG. 6 is a circuit diagram extending the bias circuit with feedback network to a power amplifier stage having multiple power amplifier cells, each with an external ballast resistance to improve common mode ballasting.

FIG. 6 shows a circuit 600 in which the concepts of the circuit 500 of FIG. 5 are expanded to cover multiple power amplifier cells. Specifically, the circuit 600 has a power amplifier stage 602 having multiple power amplifier cells 604(1)-604(N). RF signals are provided to respective bases of the power amplifier cells 604(1)-604(N) through capacitors 606(1)-606(N). Respective ballast resistors 608(1)-608(N) are also coupled to the bases of the power amplifier cells 604(1)-604(N) and provide respective bias signals thereto. A global bias circuit 610 includes respective bias circuits 612(1)-612(N) that generate the respective bias signals from bias amplifier circuits 614(1)-614(N). The bias amplifier circuits 614(1)-614(N) receive an initial bias current Ibias. The bias circuits 612(1)-612(N) each include a respective feedback network 616(1)-616(N) that includes, at a minimum, a feedback impedance 618(1)-618(N) such as a feedback resistor. Operation is similar to that discussed above for circuit 500. It should be appreciated that this concept may be extended to a differential power amplifier stage.

Figure 7:
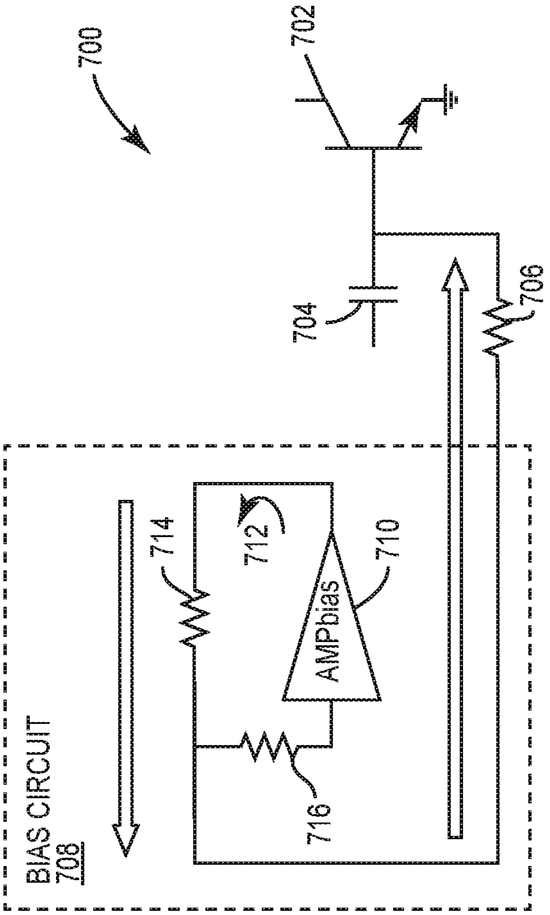
FIG. 7 is a circuit diagram showing a T-type feedback network within the bias circuit for a single power amplifier cell that also uses an external ballast resistance to improve common mode ballasting.

The feedback impedance may be arranged in a variety of ways, but an exemplary arrangement is a T-type structure as illustrated in FIG. 7. Specifically, FIG. 7 illustrates a circuit 700 that has a power amplifier cell 702. An RF signal is provided to a base of the power amplifier cell 702 through a capacitor 704. A ballast resistor 706 is also coupled to the base of the power amplifier cell 702 and provides a bias signal thereto. A bias circuit 708 generates the bias signal from a bias amplifier circuit 710. The bias amplifier circuit 710 includes a feedback network 712 that includes a T-type resistor arrangement having a resistor 714 and a resistor 716. The remainder of the T is provided by the ballast resistor 706.

Figure 8:
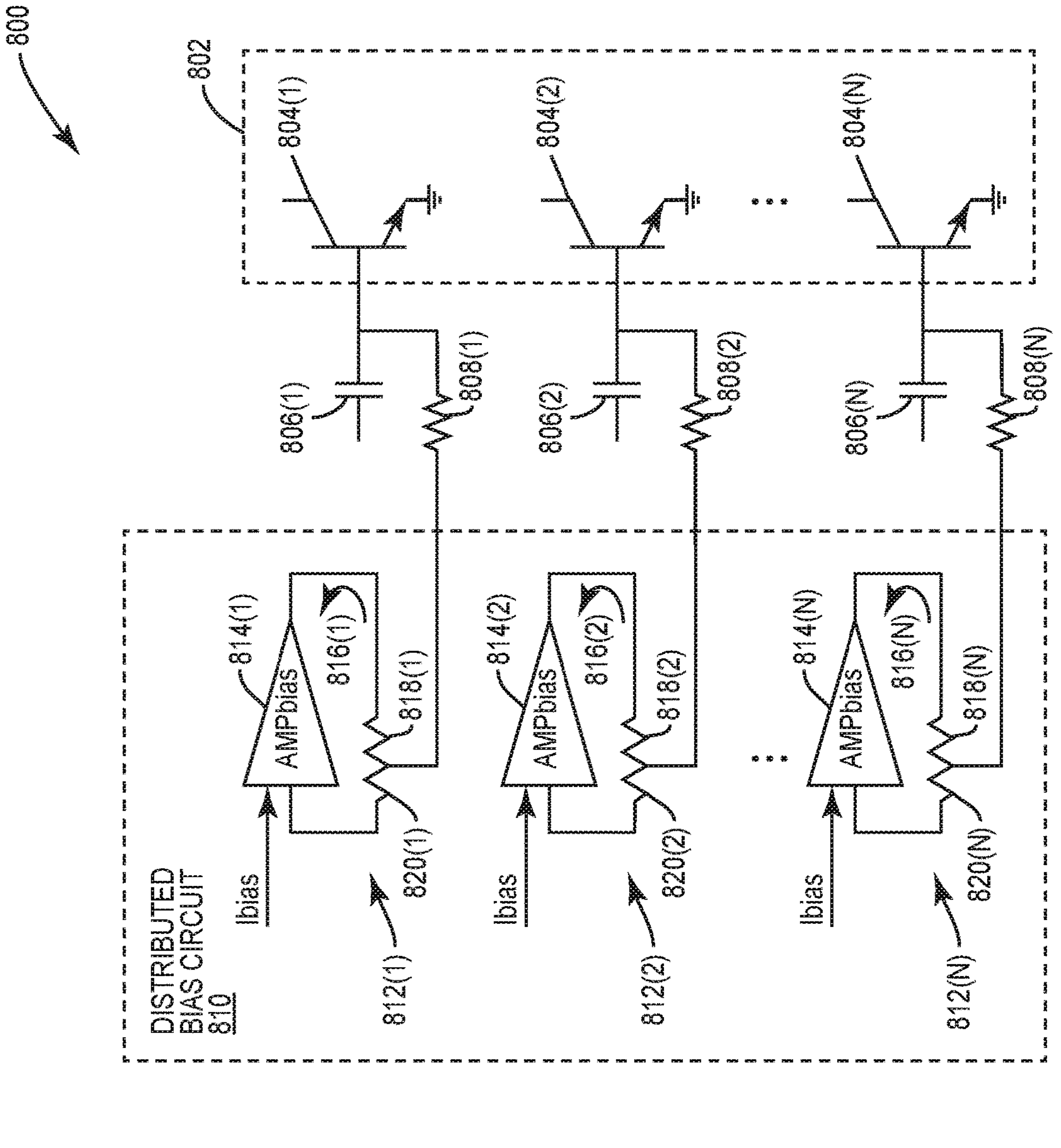
FIG. 8 is a circuit diagram extending the concept of FIG. 7 to a power amplifier stage having multiple power amplifier cells each with an external ballast resistance to improve common mode ballasting.

Again, the concepts may be extended to a power amplifier stage having multiple power amplifier cells. In this regard, FIG. 8 illustrates a circuit 800 that has a power amplifier stage 802 having multiple power amplifier cells 804(1)-804(N). RF signals are provided to respective bases of the power amplifier cells 804(1)-804(N) through capacitors 806(1)-806(N). Respective ballast resistors 808(1)-808(N) are also coupled to the bases of the power amplifier cells 804(1)-804(N) and provide respective bias signals thereto. A global bias circuit 810 includes respective bias circuits 812(1)-812(N) that generate the respective bias signals from bias amplifier circuits 814(1)-814(N). The bias amplifier circuits 814(1)-814(N) receive an initial bias current Ibias. The bias circuits 812(1)-812(N) each include a respective feedback network 816(1)-816(N) that includes a T-type resistor arrangement having a resistor 818(1)-818(N) and a resistor 820(1)-820(N). It is possible that the resistors 818(1)-818(N) and 820(1)-820(N) may be combined with a central tap. It should be appreciated that this concept may be extended to a differential power amplifier stage.

Figure 9:
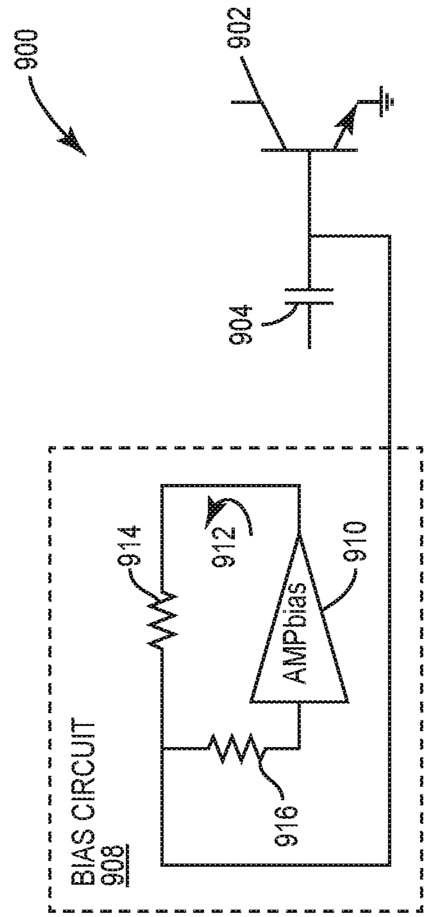
FIG. 9 is a circuit diagram showing an L-type feedback network within the bias circuit for a single power amplifier cell without an external ballast resistance.

While the examples of the circuits 500-800 of FIGS. 5-8 contemplate external ballast resistors being used to support the common mode ballasting, the present disclosure is not so limited, and the external ballast resistors may be eliminated and changed to an L-type impedance as better seen in FIG. 9. Specifically, a circuit 900 includes a power amplifier cell 902. An RF signal is provided to a base of the power amplifier cell 902 through a capacitor 904. A bias circuit 908 generates a bias signal from a bias amplifier circuit 910. The bias amplifier circuit 910 includes a feedback network 912 that includes an L-type resistor arrangement having a resistor 914 and a resistor 916. Values of the resistors 914, 916 may be chosen to provide an appropriate bias signal and desired thermal control. While not illustrated, this concept can be expanded to a plurality of power amplifier cells in a power amplifier stack and may be extended to a differential amplifier stack.

FIGS. 10-15 illustrate exemplary bias circuits that may be used with the present disclosure with the understanding that other bias circuits may be used. In general, a current mirror may be used such as a Wilson or Widlar current mirror. Still other types of feedback mirrors may also be used.

Figure 10:
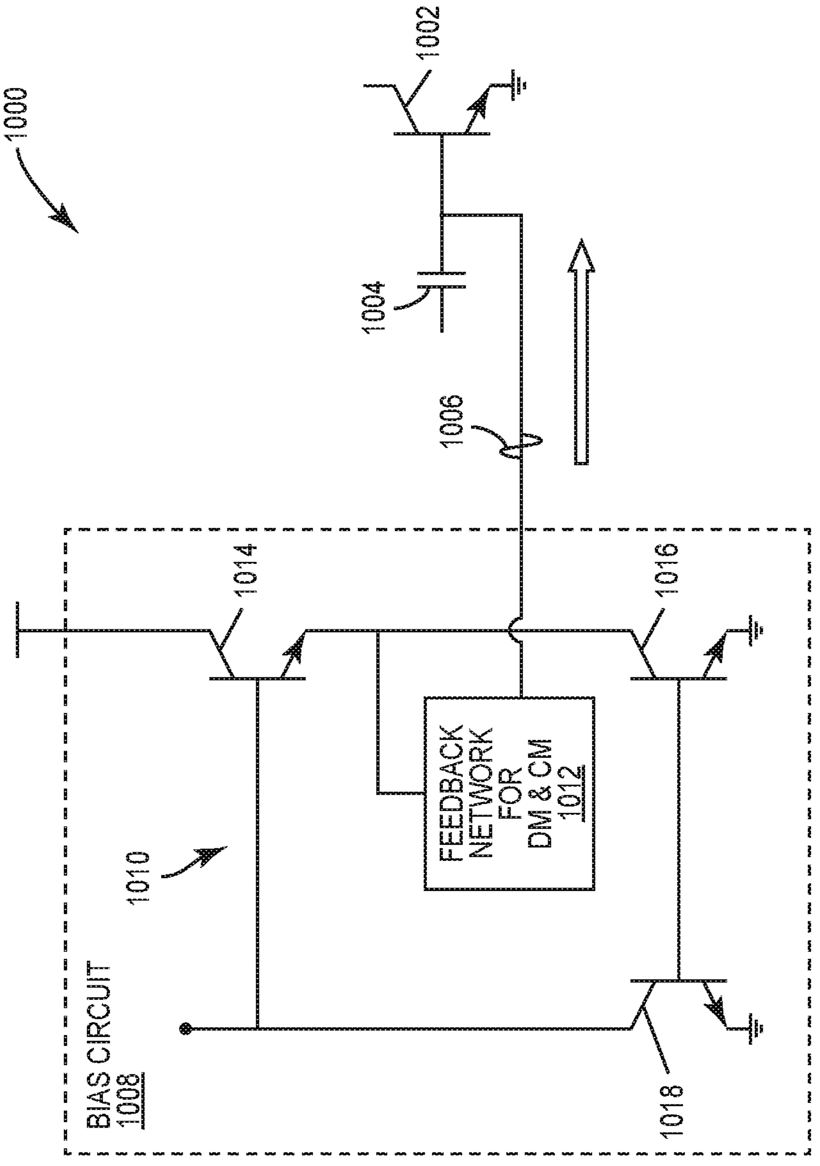
FIG. 10 is a circuit diagram showing the circuitry of the bias circuit that includes a Wilson current mirror that works with the feedback network to provide a bias signal for a single power amplifier cell without an external ballast resistance.

Turning to FIG. 10, a circuit 1000 is illustrated. The circuit 1000 has a power amplifier cell 1002. An RE signal is provided to a base of the power amplifier cell 1002 through a capacitor 1004. A bias signal 1006 is also provided to the base of the power amplifier cell 1002. A bias circuit 1008 generates the bias signal 1006 from a bias amplifier circuit 1010. The bias amplifier circuit 1010 includes a feedback network 1012. The bias amplifier circuit 1010 is a Wilson current mirror having a first transistor 1014, a second transistor 1016, and a third transistor 1018. An emitter of the first transistor 1014 is coupled to a collector of the second transistor 1016. The bases of the second and third transistors 1016, 1018 may be coupled as well. The collector of the third transistor 1018 may be coupled to the base of the first transistor 1014. The feedback network 1012 may couple the emitter of the first transistor 1014 to the bases of the second and third transistors 1016, 1018 and provide the bias signal 1006.

Figure 11:
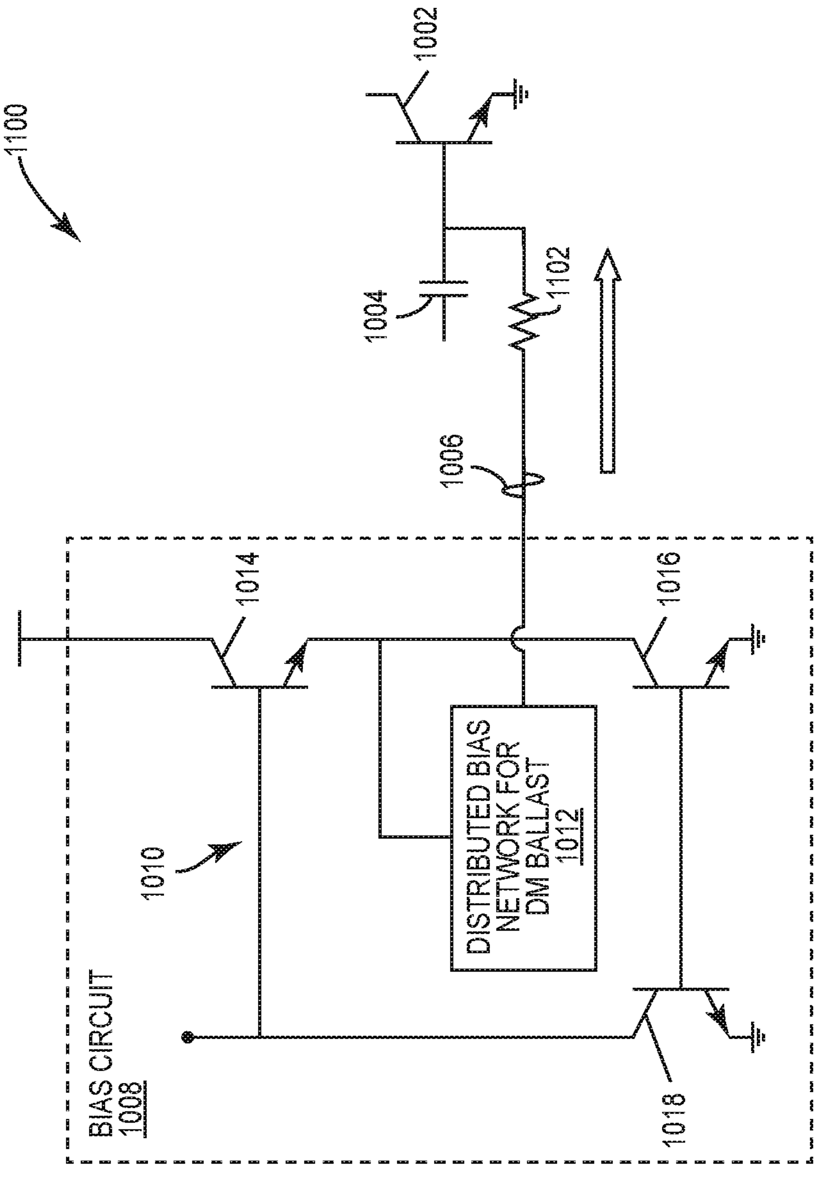
FIG. 11 shows the bias circuit of FIG. 10 with an external ballast resistance to improve common mode ballasting.

While the circuit 1000 omits an external ballast resistor, a circuit 1100 as illustrated in FIG. 11 adds a ballast resistor 1102 for improved common mode ballasting. The remaining elements of circuit 1100 are substantially identical to those of the circuit 1000 and numbers are reused.

Figure 12:
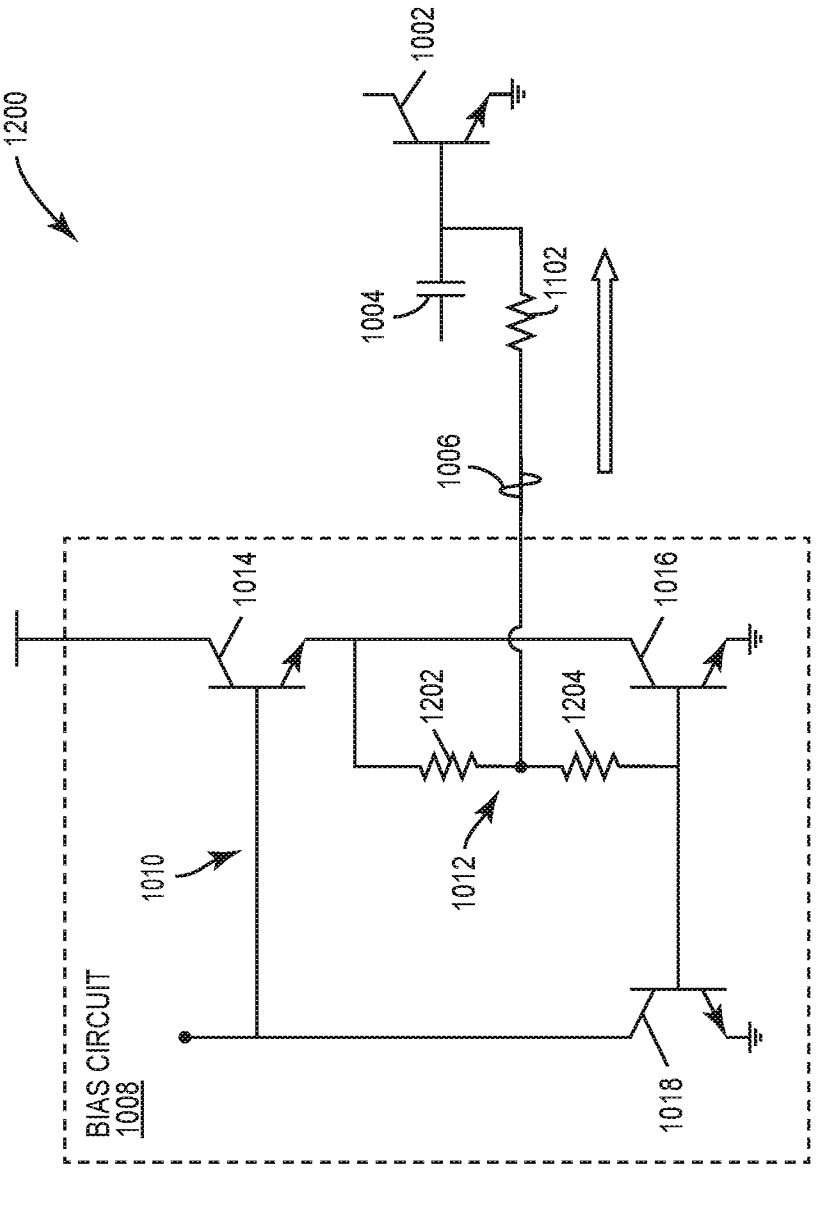
FIG. 12 shows the bias circuit of FIG. 11 with additional details about the feedback network being a T-type feedback network.

Combining the details of the circuit 700 of FIG. 7 and the circuit 1100 results in circuit 1200 illustrated in FIG. 12. Many of the elements from circuit 1100 are the same, but the details of the feedback network 1012 are expanded to show resistors 1202, 1204. The resistor 1202 provides differential mode ballasting and the resistor 1102 provides common mode ballasting. The resistors 1102, 1202, 1204 are arranged in a T-shaped configuration.

Figure 13A:
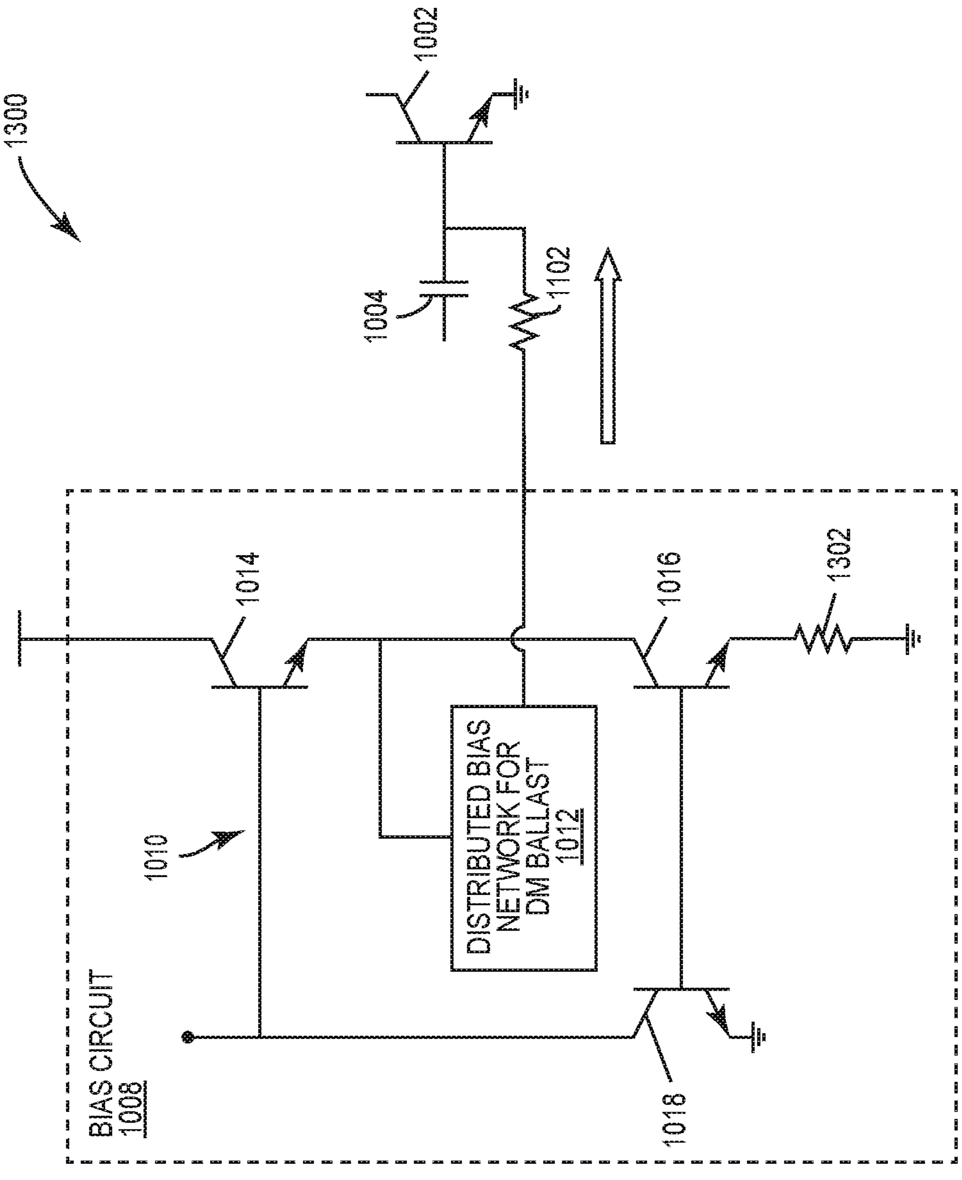
FIGS. 13A and 13B show a bias circuit having a feedback network, wherein the bias circuit may include added optional single-ended resistive degeneration.
Figure 13B:
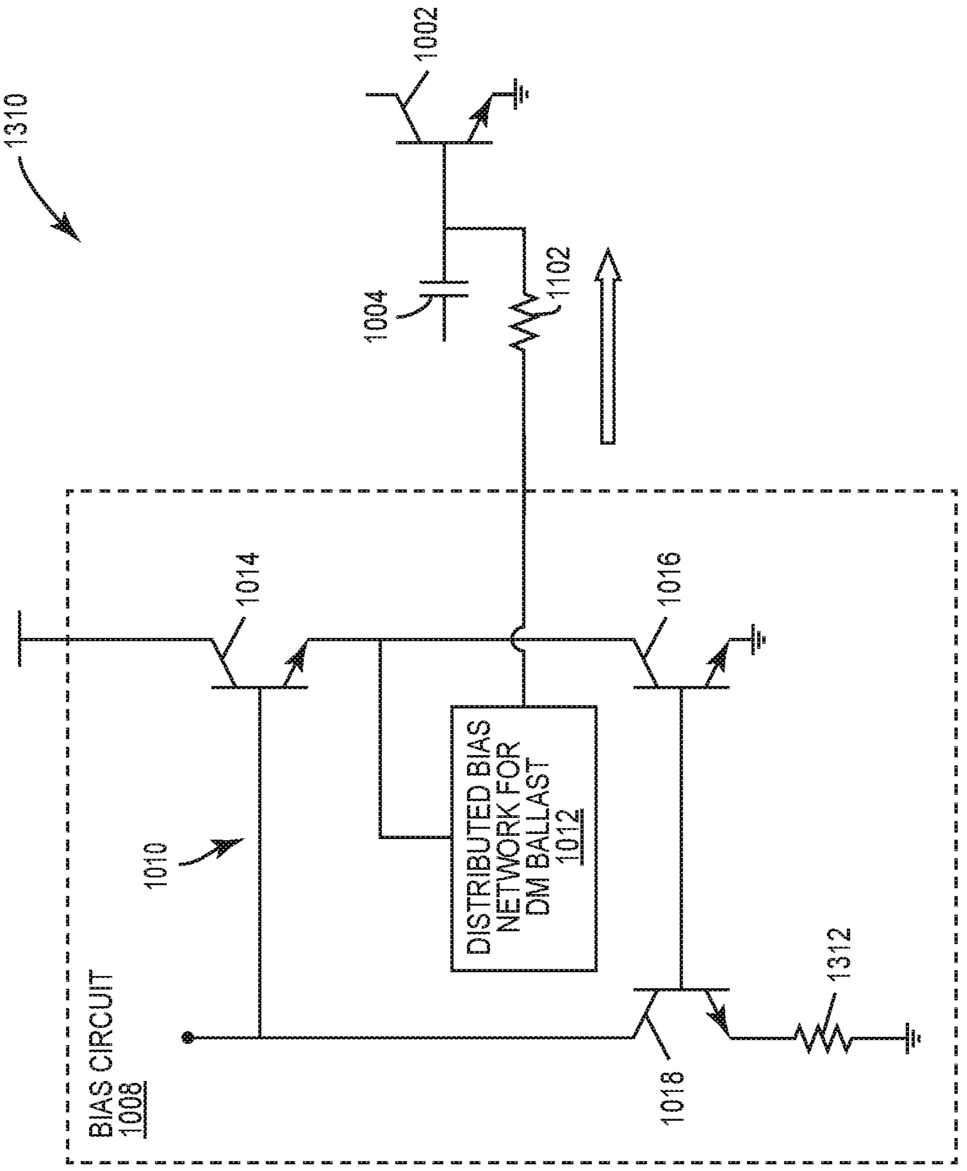
Figure 13C:
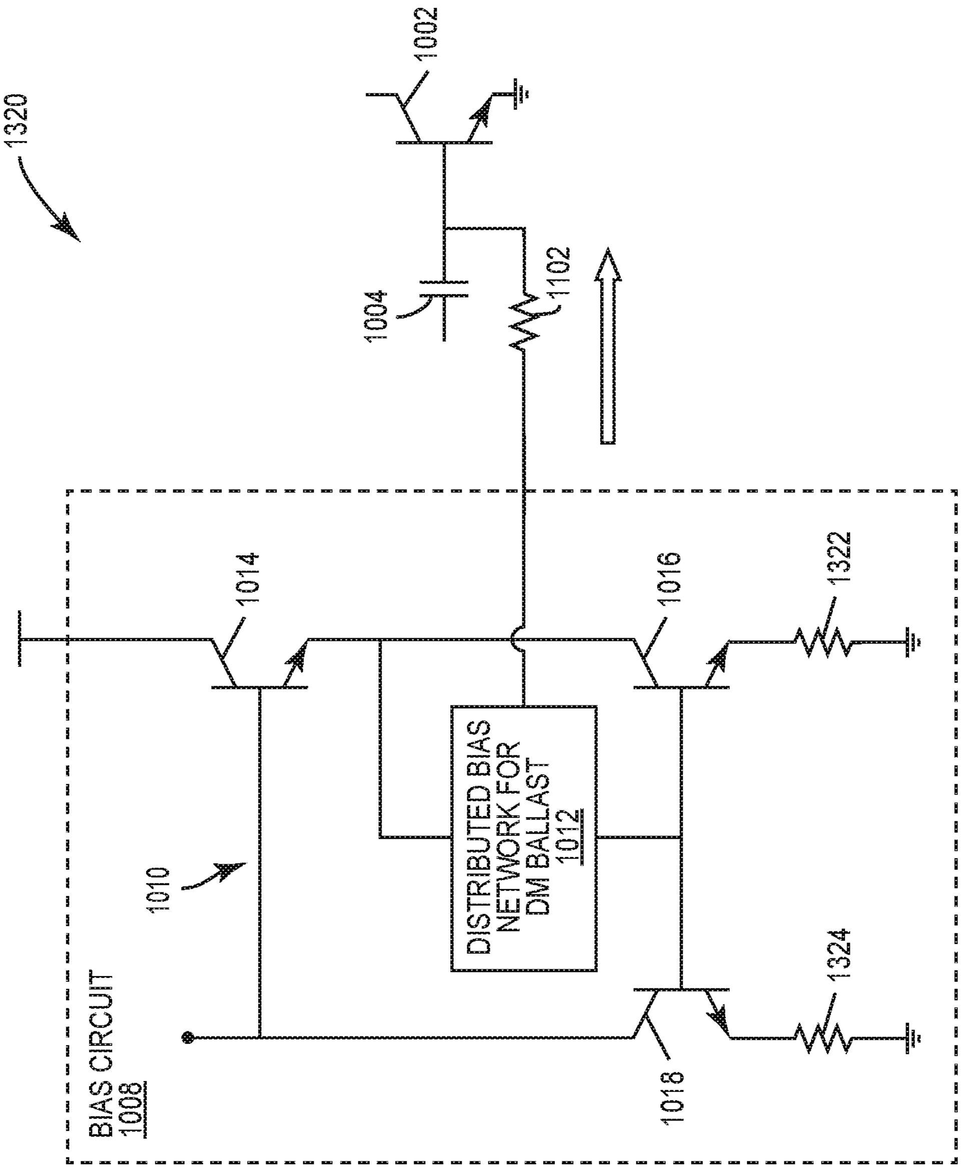
FIG. 13C shows a bias circuit having a feedback network, wherein the bias circuit may include added optional double-ended resistive degeneration.

Note that the bias circuit 1008 may be changed by adding resistive degeneration as better illustrated in FIGS. 13A-13C. Circuit 1300 in FIG. 13A is similar to the circuit 1100 of FIG. 11, but adds a degenerative resistance 1302 to the second transistor 1016. Similarly, circuit 1310 in FIG. 13B adds a degenerative resistance 1312 to the third transistor 1018. Circuit 1320 in FIG. 13C adds a first degenerative resistance 1322 to the second transistor 1016 and a second degenerative resistance 1324 to the third transistor 1018.

Figure 14:
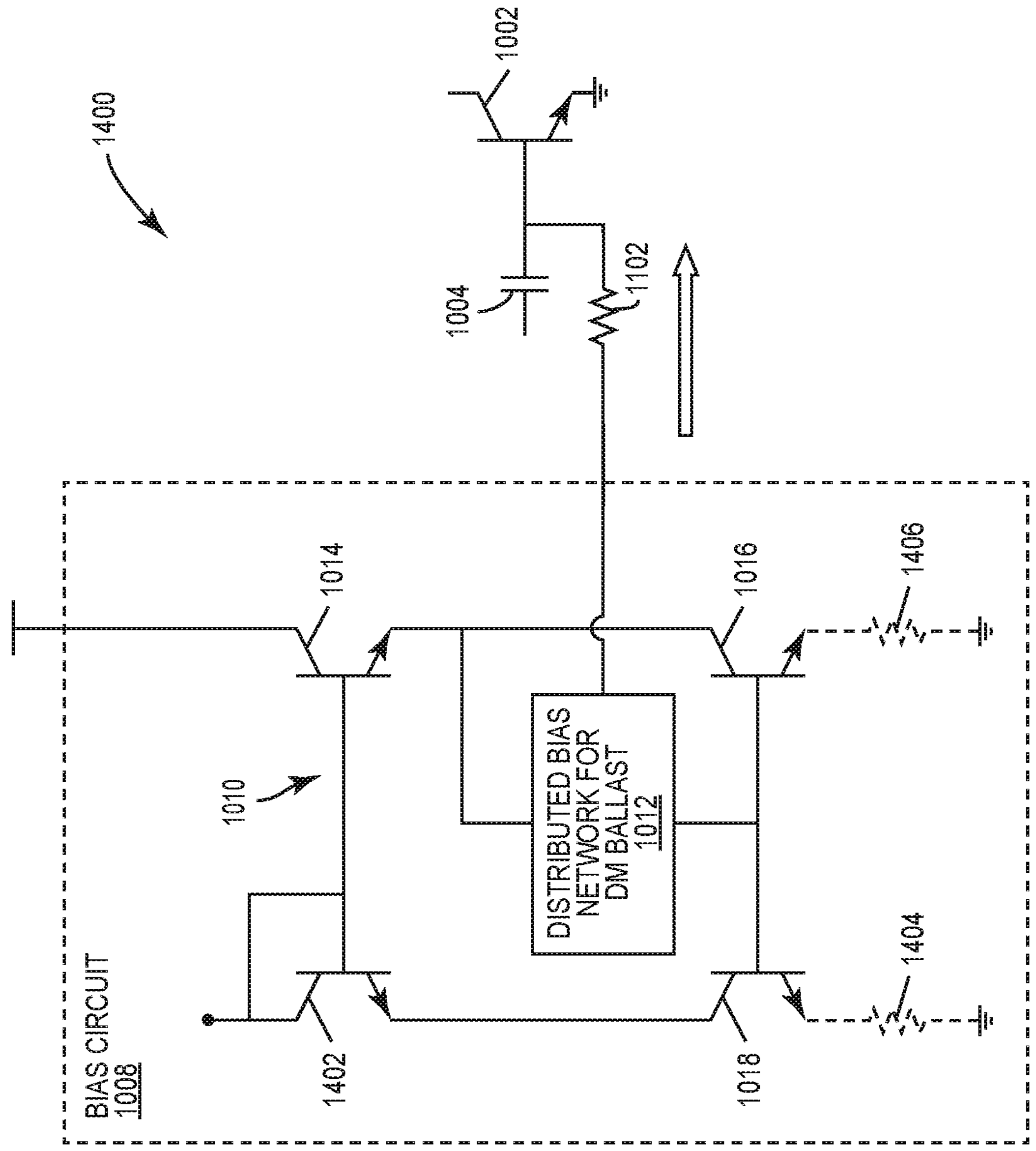
FIG. 14 shows an alternate bias circuit having a feedback network with optional resistive degeneration.

Another variation on the bias circuit is seen in circuit 1400 in FIG. 14. The Wilson current mirror has had a fourth transistor 1402 added, and may have optional degenerative resistances 1404, 1406 (either one or both).

Figure 15:
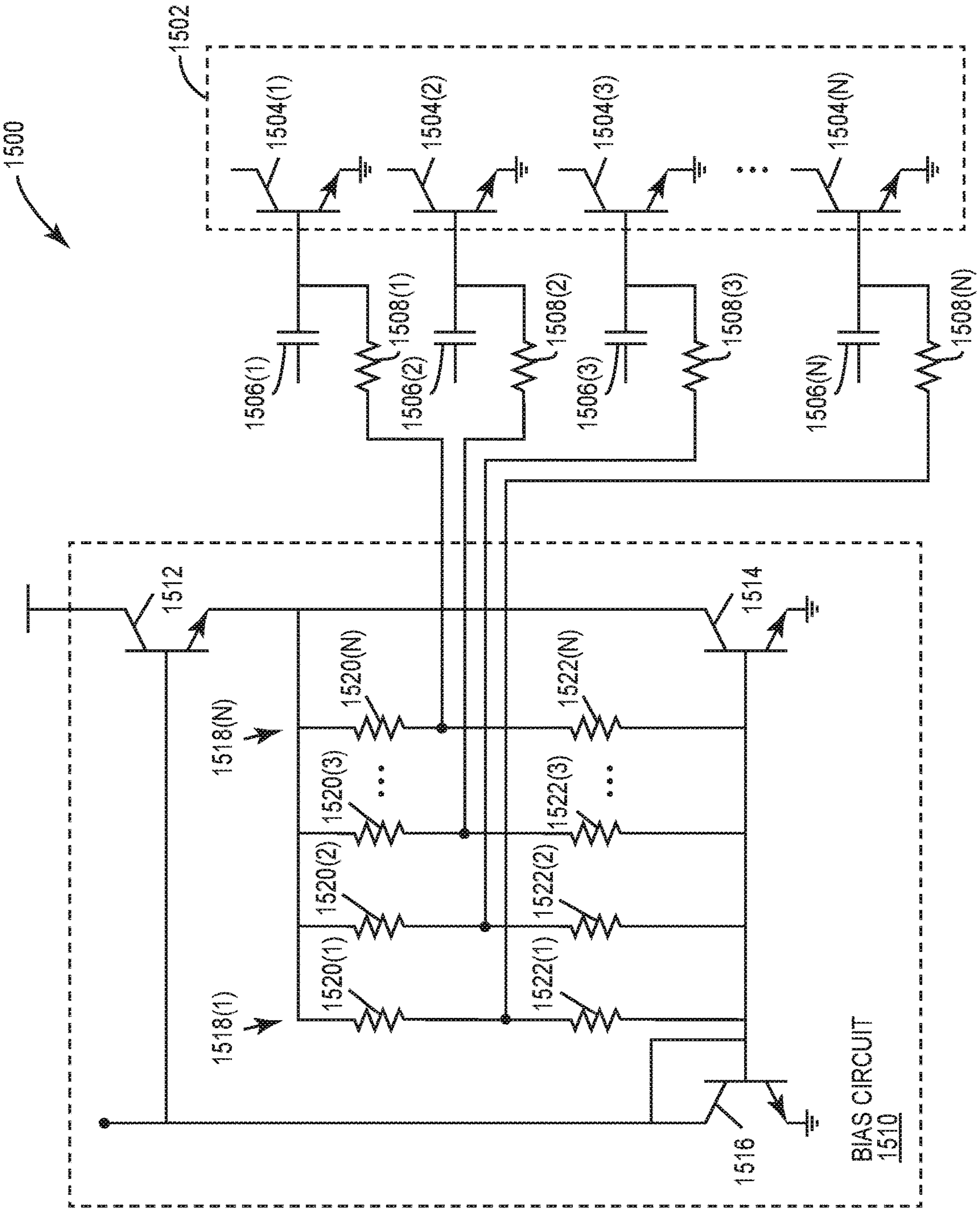
FIG. 15 is a circuit diagram illustrating how the concepts of the bias circuit of FIG. 11 may be extended to a power amplifier stage having multiple power amplifier cells.
Figure 16:
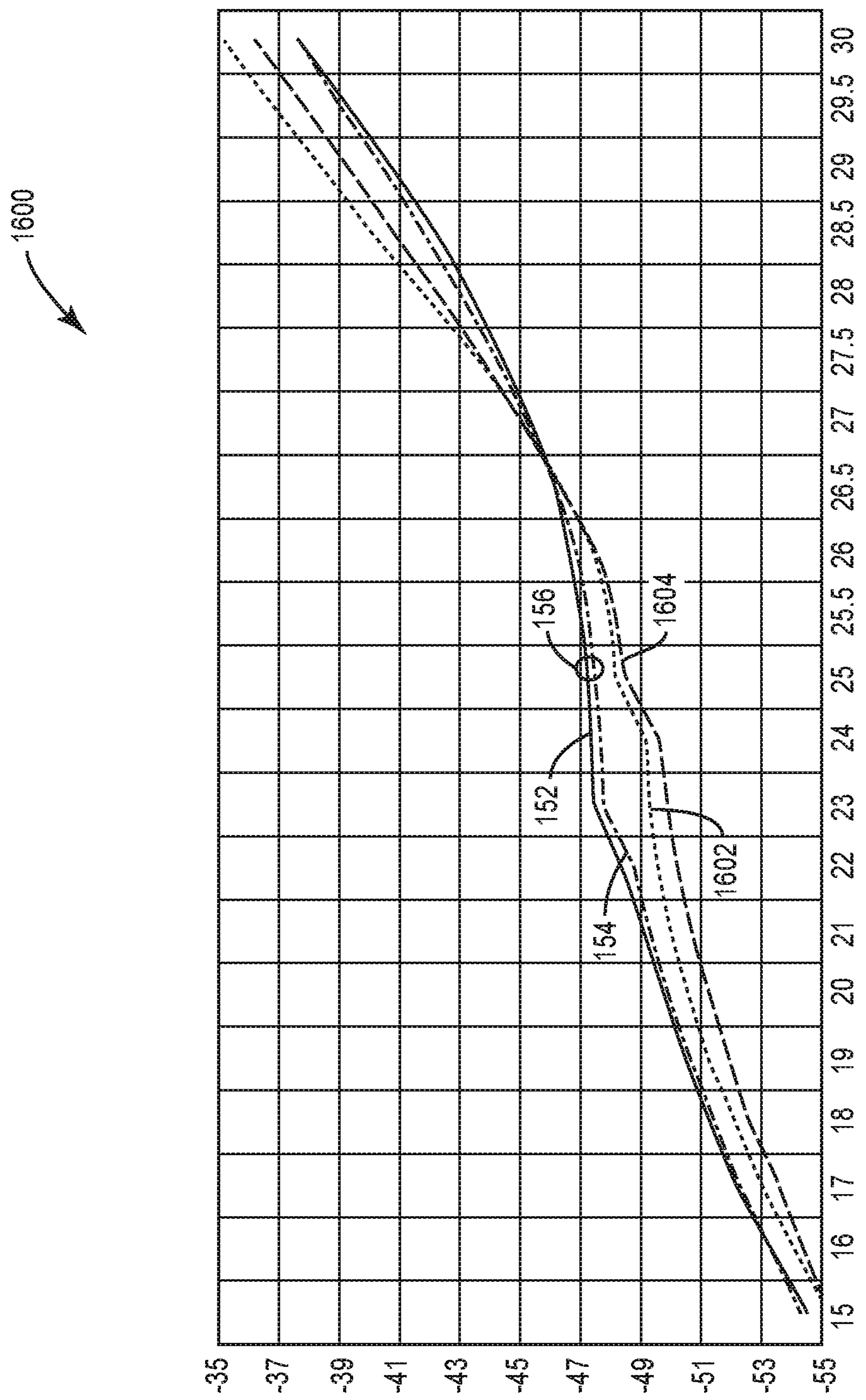

As previously indicated, the concepts of the present disclosure may be extended to power amplifier stacks having a plurality of power amplifier cells. It should be appreciated that the power amplifier stack may include a single-ended output or a differential output. In this regard, FIG. 15 illustrates a circuit 1500 having a power amplifier stack 1502 with power amplifier cells 1504(1)-1504(N). RF signals are provided to respective bases of the power amplifier cells 1504(1)-1504(N) through capacitors 1506(1)-1506(N). Respective ballast resistors 1508(1)-1508(N) are also coupled to the bases of the power amplifier cells 1504(1)-1504(N) and provide respective bias signals thereto. A global bias circuit 1510 includes a Wilson current mirror bias circuit formed from transistors 1512, 1514, and 1516 that generate a bias signal that is split amongst respective feedback networks 1518(1)-1518(N) that include a T-type resistor arrangement having a resistor 1520(1)-1520(N) and a resistor 1522(1)-1522(N). It should be appreciated that this concept may be extended to a differential power amplifier stage.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but is to be accorded the widest scope consistent with the principles and novel features disclosed herein.

What is claimed is:

1. A circuit comprising:

a power amplifier cell comprising a bipolar junction transistor (BJT) comprising an input node configured to receive a signal input, the input node coupled to a base of the BJT;

a ballast resistor coupled to the base of the BJT electrically in parallel with the input node and without passing through the input node; and a bias circuit comprising:

an input;

a first transistor, a second transistor, and a third transistor, a first collector of the first transistor coupled to the input;

an output coupled to the power amplifier cell through the ballast resistor, the bias circuit configured to provide a bias signal to the power amplifier cell through the ballast resistor; and a feedback network comprising an impedance, the impedance comprising a first resistor and a second resistor, wherein a first emitter of the first transistor couples to:

the output through the first resistor;

a second base of the second transistor serially through the first resistor and the second resistor and a third base of the third transistor serially through the first resistor and the second resistor, wherein the second base is directly coupled to the third base, the feedback network configured to, in combination with the ballast resistor, provide a ballast resistance to the bias signal under three hundred ohms (300Ω).

2. The circuit of claim 1, wherein the ballast resistor is less than 150Ω.

3. The circuit of claim 1, wherein the ballast resistor is less than approximately 50Ω.

4. The circuit of claim 1, further comprising a capacitor coupled to the input node of the power amplifier cell and configured to receive a radio frequency (RF) input signal.

5. The circuit of claim 1, wherein the bias circuit is coupled to a power amplifier stack and the power amplifier cell is one of a plurality of power amplifier cells within the power amplifier stack.

6. The circuit of claim 5, wherein the power amplifier stack comprises a differential output.

7. The circuit of claim 5, wherein the power amplifier stack comprises a single-ended output.

8. The circuit of claim 1, wherein the first, second, and third transistors of the bias circuit form a Wilson current mirror.

9. The circuit of claim 1, wherein the first, second, and third transistors of the bias circuit form a Widlar current mirror.

10. The circuit of claim 1, wherein the feedback network forms a T-shaped impedance circuit from the first resistor, the second resistor and the ballast resistor.

11. The circuit of claim 1, wherein the first resistor is serially coupled to the ballast resistor relative to the first emitter.

12. The circuit of claim 1, wherein the feedback network comprises a loop gain and impedance seen by the bias signal is based on the loop gain.

13. A mobile communication device comprising:

communication circuitry comprising:

a power amplifier cell comprising a bipolar junction transistor (BJT) comprising an input node configured to receive a signal input, the input node coupled to a base of the BJT;

a ballast resistor coupled to the base of the BJT electrically in parallel with the input node and without passing through the input node; and a bias circuit comprising:

an input;

a first transistor, a second transistor, and a third transistor, a first collector of the first transistor coupled to the input;

an output coupled to the power amplifier cell through the ballast resistor, the bias circuit configured to provide a bias signal to the power amplifier cell through the ballast resistor; and a feedback network comprising an impedance, the impedance comprising a first resistor and a second resistor, wherein a first emitter of the first transistor couples to:

the output through the first resistor;

a second base of the second transistor serially through the first resistor and the second resistor, and a third base of the third transistor serially through the first resistor and the second resistor, wherein the second base is directly coupled to the third base, the feedback network configured to, in combination with the ballast resistor, provide a ballast resistance to the bias signal under three hundred ohms (300Ω).

* * * * *